(12) United States Patent
Azuma et al.

(10) Patent No.: US 7,455,530 B2
(45) Date of Patent: *Nov. 25, 2008

(54) DISPLAY APPARATUS

(75) Inventors: Yuji Azuma, Mobara (JP); Masaki Tsubokura, Mobara (JP)

(73) Assignee: Hitachi Displays, Ltd., Mobara-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/764,375

(22) Filed: Jun. 18, 2007

(65) Prior Publication Data

US 2007/0236875 A1    Oct. 11, 2007

Related U.S. Application Data

(63) Continuation of application No. 11/602,231, filed on Nov. 21, 2006, now Pat. No. 7,234,945.

(30) Foreign Application Priority Data

Nov. 21, 2005    (JP) ............... 2005-335885

(51) Int. Cl.
*H01R 12/00* (2006.01)
(52) U.S. Cl. .................. 439/67; 439/862; 349/149
(58) Field of Classification Search ............ 439/67, 439/77, 862; 349/149, 150
See application file for complete search history.

(56) References Cited

U.S. PATENT DOCUMENTS

| | | |
|---|---|---|
| 6,504,589 B1 | 1/2003 | Kashima |
| 6,995,814 B2 | 2/2006 | Kanatsu |
| 7,108,515 B2 | 9/2006 | Tanabe et al. |
| 7,234,945 B2 * | 6/2007 | Azuma et al. ............ 439/67 |

FOREIGN PATENT DOCUMENTS

JP    2000-75273    3/2000

\* cited by examiner

*Primary Examiner*—Khiem Nguyen
(74) *Attorney, Agent, or Firm*—Antonelli, Terry, Stout & Kraus, LLP.

(57) ABSTRACT

A display apparatus includes a display panel, a flexible printed wiring board, a printed circuit board, a support member to support the display panel and the printed circuit board, and a frame member to cover the printed circuit board and to assist support of the display panel. The printed circuit board is supported at a side surface of the support member by bending the flexible printed wiring board, and the support member includes, at the side surface for supporting the printed circuit board, a first support part to support one end side of the printed circuit board which is opposite to another end side to which the flexible printed wiring board is connected, and a second support part to support the another end side of the printed circuit board. The frame member has a contact portion for contacting the printed circuit board.

7 Claims, 11 Drawing Sheets

DISPLAY APPARATUS

This application is a continuation of U.S. application Ser. No. 11/602,231, filed Nov. 21, 2006 now U.S. Pat. No. 7,234,945, the contents of which are incorporated herein by reference. The present application claims priority from Japanese application JP2005-335885 filed on Nov. 21, 2005, the content of which is hereby incorporated by reference into this application.

BACKGROUND OF THE INVENTION

1. Field of the Invention

The present invention relates to a display apparatus, and particularly to a technique effectively applied to a display apparatus, such as a liquid crystal display apparatus, including a printed circuit board connected to an outer peripheral part of a display panel through a flexible printed wiring board.

2. Background Art

Heretofore, as a display apparatus, there is an apparatus, such as a liquid crystal display apparatus, to display an image by driving TFT elements arranged in respective pixel areas on a display panel.

The liquid crystal display apparatus includes a liquid crystal display panel in which a liquid crystal material is sealed between a pair of substrates. In the liquid crystal display-panel, for example, plural data signal lines and scanning signal lines are arranged in a grid form on one of the substrates, and an area surrounded by two adjacent data signal lines and two adjacent scanning signal lines corresponds to one pixel area. The TFT element having a gate electrode connected to the scanning signal line and a drain electrode connected to the data signal line is arranged in each pixel area.

Besides, the liquid crystal display apparatus includes a printed circuit board to send vide signals and the like to the data signal lines of the liquid crystal display panel, and a printed circuit board to send scanning signals to the scanning signal lines, and these printed circuit boards are arranged at an outer peripheral part of the liquid crystal display panel. Besides, at this time, wiring lines of the respective printed circuit boards and the data signal lines of the liquid crystal display panel or the scanning signal lines are connected to each other through a flexible printed wiring board. Besides, at this time, for example, a driver IC is mounted on the flexible printed wiring board.

Besides, in the liquid crystal display apparatus, the liquid crystal display panel is supported in such a manner that the outer peripheral part is sandwiched between a pair of frame members. Besides, at this time, the printed circuit board is attached to, for example, a side surface of one of the frame members and is supported (see, for example, patent document 1).

[Patent document 1] JP-A-2000-75273 (U.S. Pat. No. 6,504,589)

Figure 11:
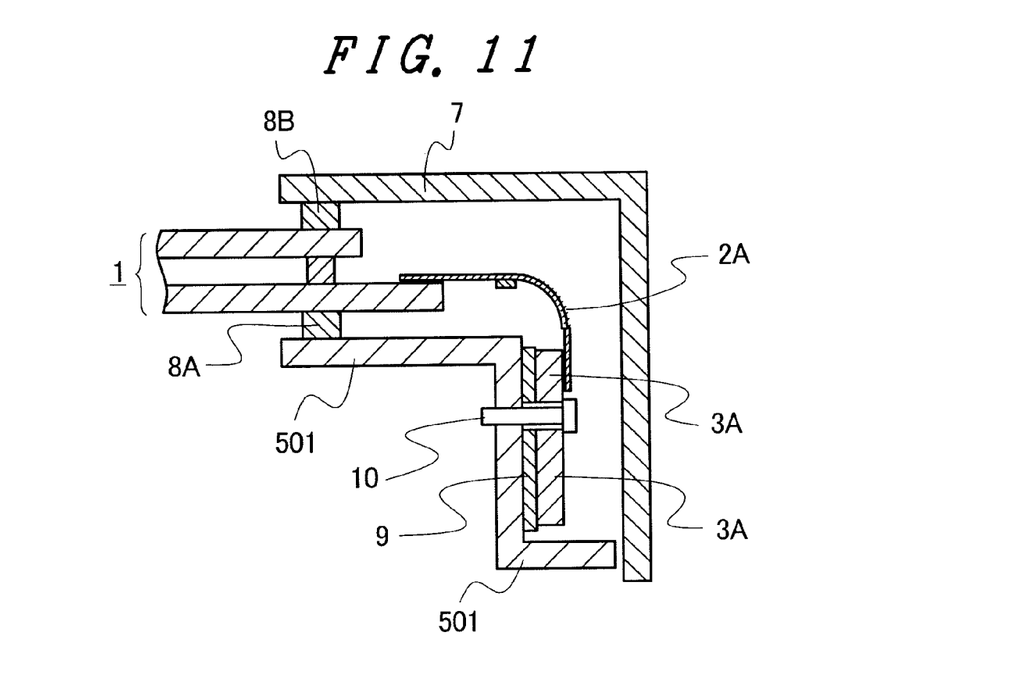
FIG. 11 is a schematic sectional view showing an example of a support method of a printed circuit board in a conventional liquid crystal display apparatus.

In the conventional liquid crystal display apparatus, the printed circuit board is supported at the side surface of the one frame member of the pair of frame members, which support the liquid crystal display panel, by, for example, screwing. FIG. 11 is a schematic sectional view showing an example of a support method of the printed circuit board in the conventional liquid crystal display apparatus.

In the conventional liquid crystal display apparatus, for example, as shown in FIG. 11, a liquid crystal display panel 1 is supported so as to be sandwiched between an upper frame 7 and a lower frame 501. At this time, spacers 8A and 8B made of, for example, elastic material respectively intervene between the liquid crystal display panel 1 and the respective frames 7 and 501. A printed circuit board 3A connected to the liquid crystal display panel 1 through a flexible printed wiring board 2A is supported at the side surface of the lower frame 501. At this time, the lower frame 501 is formed by molding of a metal material, and a printed circuit board 3A is disposed at the side surface of the lower frame 501 through an insulating sheet 9 and is fixed by a screw 10.

However, in the support method of the printed circuit board 3A as stated above, it is necessary that the insulating sheet 9 and the printed circuit board 3A are disposed at the side surface of the lower frame 502, holes for screwing provided in both are aligned and screwing is performed. Besides, when the screwing is performed, it is necessary to perform the screwing so that shaking of the printed circuit board 3A is suppressed, and the printed circuit board 3A is not deformed, and the adjustment of the fastening force is difficult. Besides, since the printed circuit board 3A is fixed to the side surface of the lower frame 502, the operation is performed while the screwing portion is seen from an oblique direction. Thus, there has been a problem that the operation efficiency of the fixing operation of the printed circuit board 3A is poor.

Figure 12:
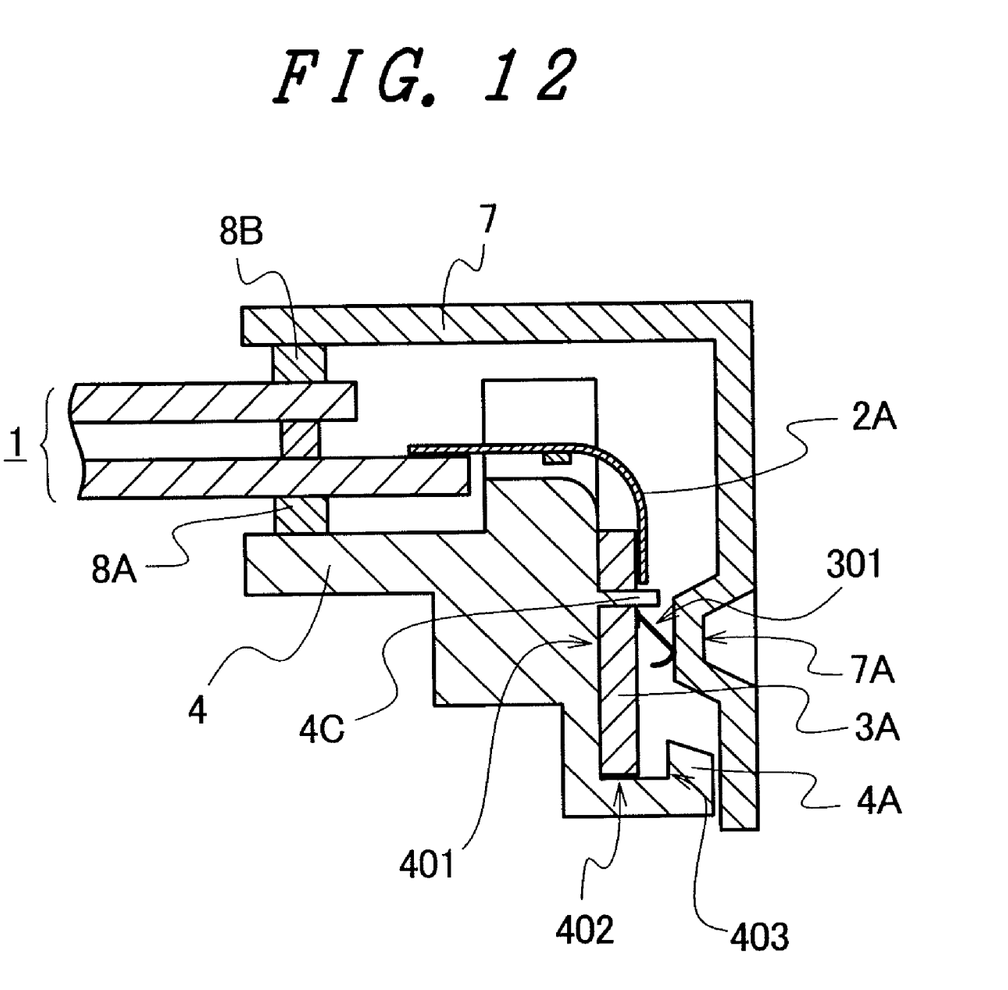
FIG. 12 is a schematic sectional view showing another example of a support method of a printed circuit board in a conventional liquid crystal display apparatus.

As a method of solving the problem as stated above, for example, as shown in FIG. 12, there is proposed a method of using a support member 4 having a groove-like support part 4A and a projection 4C. This support member 4 is formed by, for example, plastic molding, and the groove-like support part 4A is provided at an end of the printed circuit board 3A, which is opposite to an end to which the flexible printed wiring board 2A is connected. The projection-like support part 4C is provided at the position where the hole for screwing is provided in the printed circuit board 3A.

Figure 13:
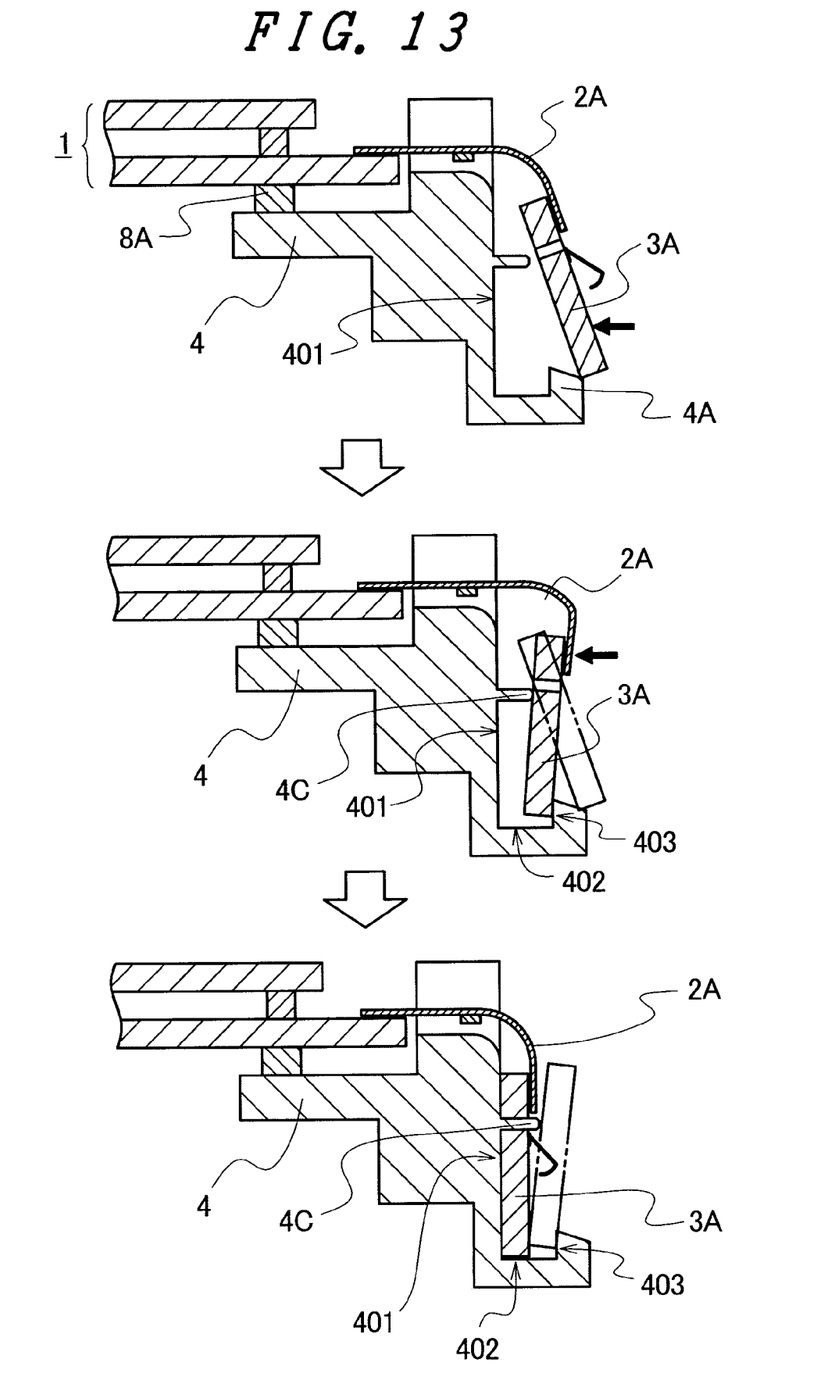
FIG. 13 is a view showing a procedure for fixing a printed circuit board to a support member in the support method shown in FIG. 12.

When the printed circuit board 3A is supported by the support member 4 as stated above, for example, as shown in FIG. 13, after the display panel 1 is placed on the support member 4, the end of the printed circuit board 3A, which is opposite to the end to which the flexible printed circuit board 2A is connected, is inserted into the groove-like support part 4A of the support member 4. While the printed circuit board 3A is pressed in a direction toward a side surface 401 of the support member 4, the projection-like support part 4C of the support member 4 is inserted into the hole for screwing of the printed circuit board 3A. By doing so, the movement of the printed circuit board 3A in the vertical direction can be suppressed.

In the case where the support member 4 is formed by plastic molding, for example, as shown in FIG. 12, a plate spring-like ground member 301 is provided at a surface of the printed circuit board 3A opposite to the upper frame 7, and grounding is performed by bringing the ground member 301 into contact with the upper frame 7. Thus, the movement of the printed circuit board 3A in the horizontal direction can be suppressed by, for example, the restoring force of the ground member 301.

Figure 14:
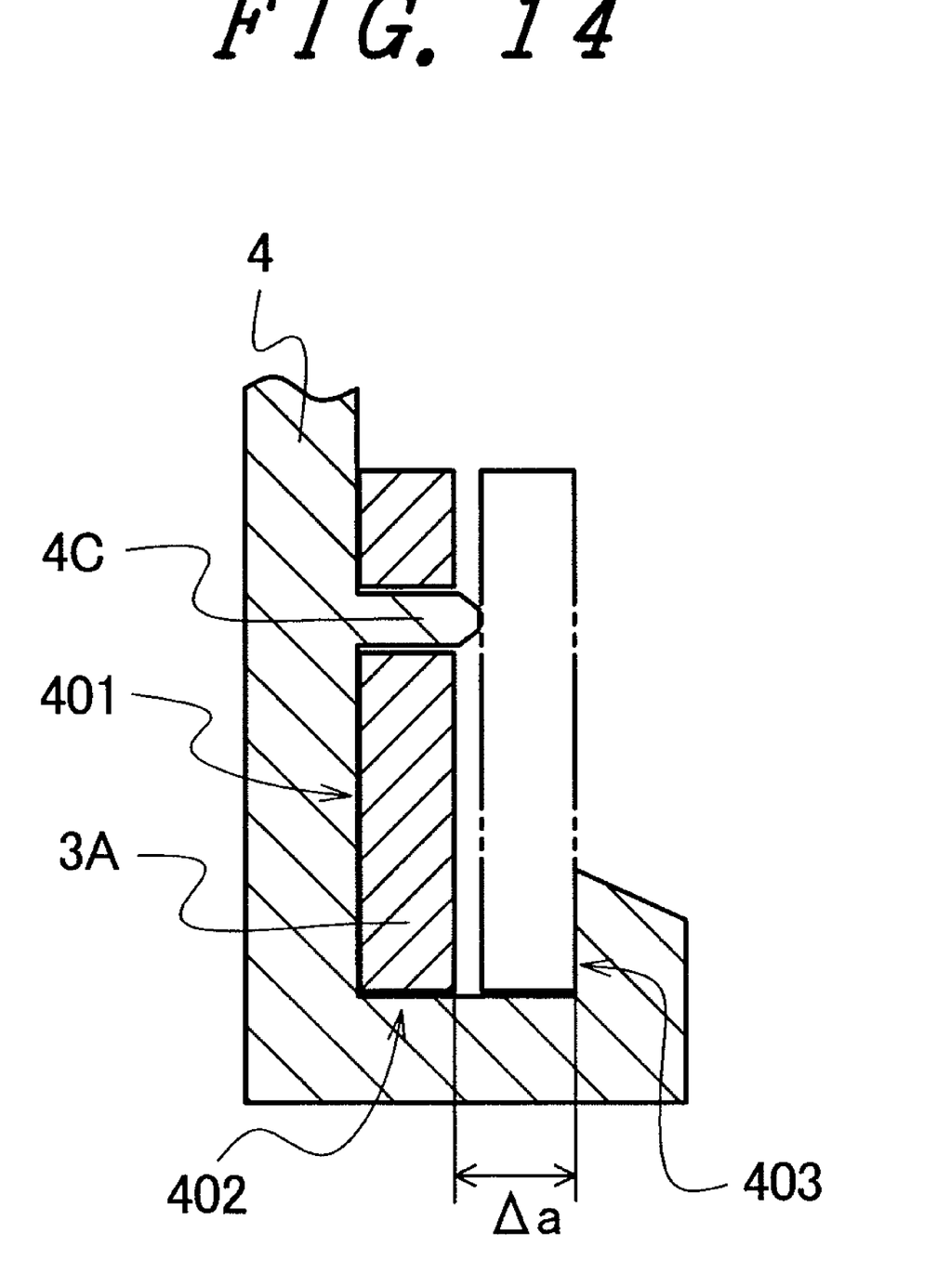
FIG. 14 is a schematic view for explaining a problem in the support method shown in FIG. 12.

However, in the support method as stated above, in order to insert the printed circuit board 3A into the groove-like support part 4A, for example, as shown in FIG. 14, it is necessary to increase a difference Δa between a distance from the side surface 401 of the support member 4 to a second support surface 403 of the groove-like support part 4A and a thickness of the printed circuit board. Thus, the printed circuit board 3A can move in the horizontal direction by the difference Δa, and bend deformation is applied to the ground member 301 by the movement. As a result, there has been a problem that for example, the ground member 301 is plastically deformed, so that the contact with the upper frame 7 can not be ensured, and grounding can not be performed.

SUMMARY OF THE INVENTION

The invention has an object to provide a technique in which when a display apparatus is assembled, workability of an operation for fixing a printed circuit board disposed at an outer peripheral part of a display panel to a support member can be improved.

The invention has another object to provide a technique in which in a display apparatus, electrical continuity between a ground member of a printed circuit board and a conductive frame member can be ensured.

The above objects and other objects of the invention and novel features would become apparent from the description of the present specification and the accompanying drawings.

Representative ones of inventions disclosed in the specification will be briefly described as follows.

(1) A display apparatus includes a present panel on which plural data signal lines and plural scanning signal lines are arranged in a grid form, a flexible printed wiring board including wiring lines connected to the data signal lines or the scanning signal lines of the display panel, a printed circuit board including wiring lines connected to the wiring lines of the flexible printed wiring board, a support member to support the display panel and the printed circuit board, and a frame member to cover the printed circuit board and to assist support of the display panel, in which the printed circuit board is supported at a side surface of the support member by bending the flexible printed wiring board, the support member includes, at the surface for supporting the printed circuit board, a first support part to support a second end side of the printed circuit board opposite to a first end to which the flexible printed wiring board is connected and a second support part to support the first end side of the printed circuit board, the first support part is a groove-like support part including a first support surface opposite to a side surface of the second end of the printed circuit board and a second support surface opposite to a vicinity of an end of a back surface of a surface of the printed circuit board opposite to the support member, and the second support part is a projection-like support part provided outside an area where the printed circuit board is supported.

(2) In the display apparatus of (1), the frame member is a conductive member, the printed circuit board includes a plate spring-like ground member at the back surface of the surface opposite to the support member, and the ground member is in contact with the frame member.

(3) In the display apparatus of (1), the printed circuit board is connected with plural flexible printed wiring boards, and the second support part of the support member is provided between the respective flexible printed wiring boards.

(4) In the display apparatus of any one of (1), the second support surface of the first support part of the support member includes an inclined surface part in which as a distance from the first support surface becomes large, a distance from the side surface becomes large.

(5) In the display apparatus of anyone of (1), a difference between a distance from the side surface of the support member to the second support surface and a thickness of the printed circuit board is larger than a difference between a distance from the first support surface to the second support part and a width of the printed circuit board.

(6) In the display apparatus of any one of (1), a difference between a distance from the side surface of the support member to the second support surface and a thickness of the printed circuit board is smaller than a difference between a distance from the first support surface to the second support part and a width of the printed circuit board.

In the display apparatus of the invention, like the means (1), the end of the printed circuit board opposite to the end to which the flexible printed wiring board is connected is supported by the groove-like first support part including the first support surface and the second support surface, and the end to which the flexible printed wiring board is connected is supported by the projection-like second support part provided outside the support area. Thus, the width of the groove of the first support part, in other words, the distance from the side surface to the second support surface can be made small, and the movement of the printed circuit board in a direction perpendicular to the side surface of the support member can be suppressed. Besides, since the printed circuit board is supported so as to be sandwiched between the first support surface of the first support part and the second support part, the movement in a direction parallel to the side surface of the support member of the printed circuit board can be suppressed.

When the printed circuit board is supported by the support member as stated above, after one end of the printed circuit board is inserted into the first support part, the other end has only to be brought into contact with the side surface of the support member. Thus, in an assembling process of the display apparatus, workability of an operation for supporting and fixing the printed circuit board is improved.

Besides, as in the means (2), the plate spring-like ground member is provided on the printed circuit board, and when the ground member is brought into contact with the frame member to endure electrical continuity, the movement of the printed circuit board in the direction perpendicular to the side surface of the support member can be suppressed also by the restoring force of the ground member. Besides, when the ground member is brought into contact with the frame member to ensure the electrical continuity, the frame member formed by, for example, plastic molding can be used.

Besides, in general, plural flexible printed wiring boards are connected to the printed circuit board. Thus, it is preferable that as in the means (3), the second support part of the support member is provided between the flexible printed wiring boards, and the second support part does not come in contact with the flexible printed wiring board.

Besides, as in the means (4), when the inclined surface is provided at the second support surface of the first support part of the support member, the end of the printed circuit board is easily inserted into the first support part, and the workability is further improved.

Besides, at this time, with respect to the relation between the difference between the distance from the side surface of the support member to the second support surface and the thickness of the printed circuit board, and the difference between the distance from the first support surface to the second support part and the width of the printed circuit board, for example, as in the means (5), the difference between the distance from the side surface of the support member to the second support surface and the thickness of the printed circuit board may be larger, or as in means (6), the difference between the distance from the side surface of the support member to the second support surface and the thickness of the printed circuit board may be smaller.

DETAILED DESCRIPTION OF THE INVENTION

Hereinafter, the invention, together with embodiments (examples), will be described in detail with reference to the drawings.

Incidentally, in all drawings for explaining the embodiments, portions having the same function are denoted by the same reference numeral and the repetitive explanation will be omitted.

Figure 1:
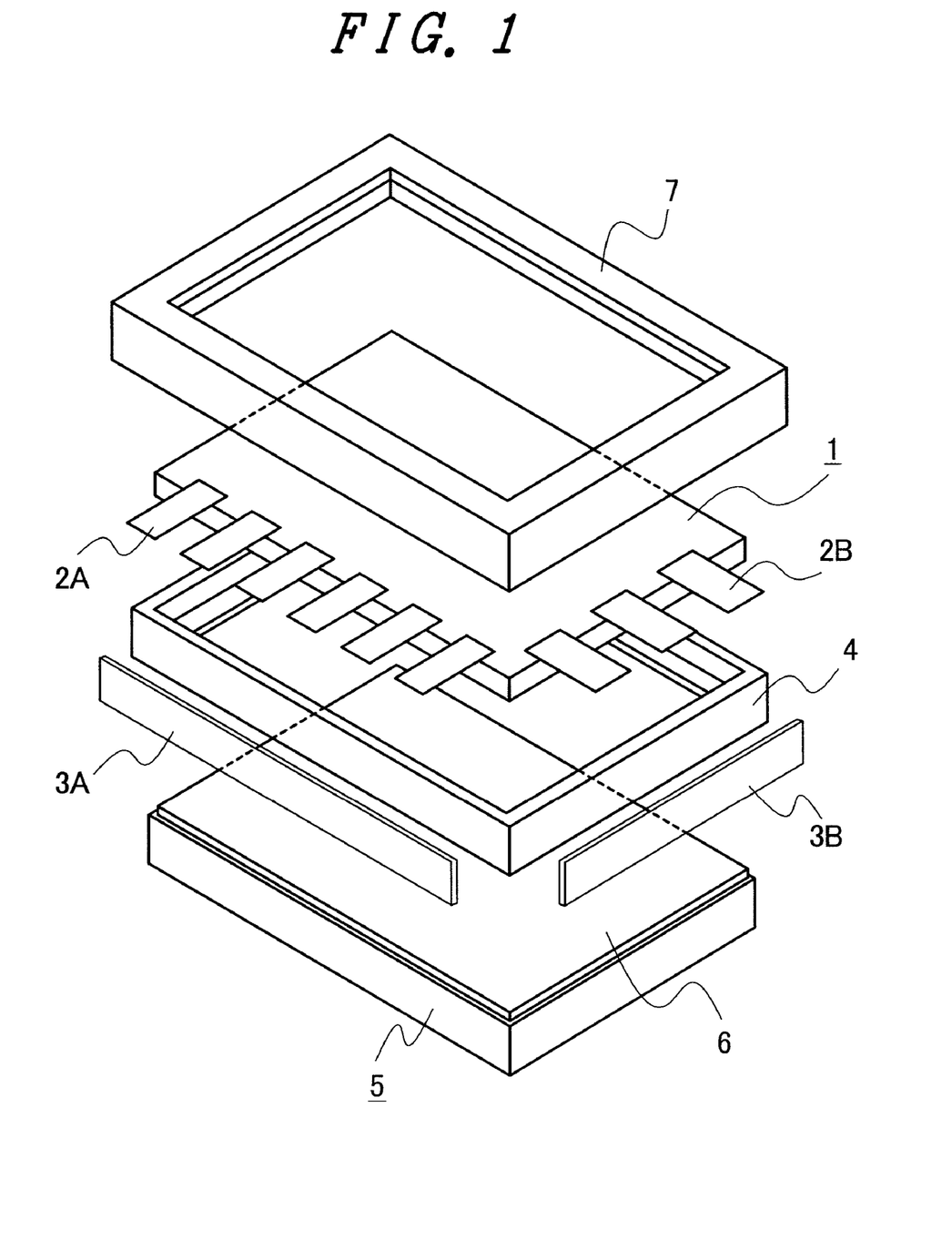
FIG. 1 is a schematic view showing a rough structure of a liquid crystal display apparatus of an embodiment of the invention and is an exploded perspective view showing a structural example of the apparatus.
Figure 2:
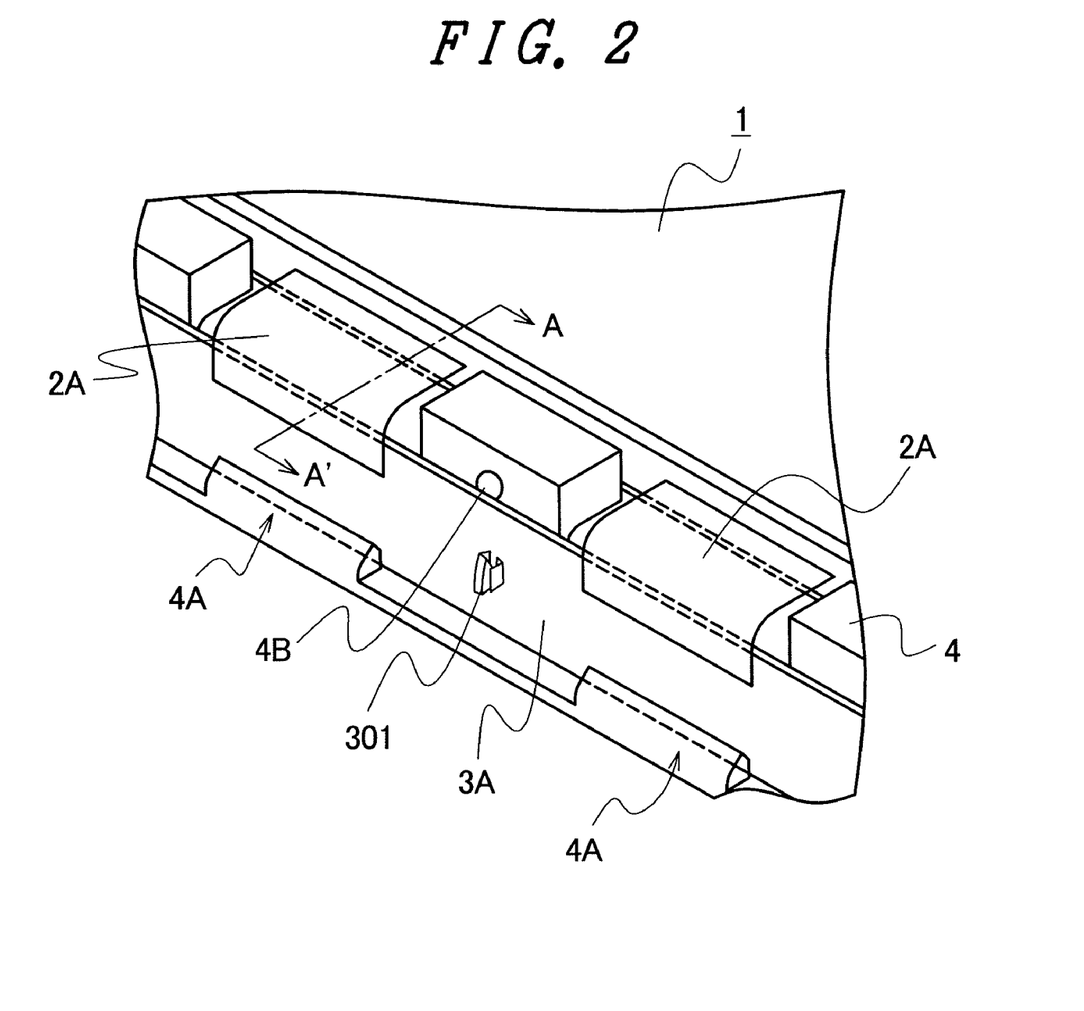
FIG. 2 is a schematic view showing a rough structure of the liquid crystal display apparatus of the embodiment of the invention and is a partial enlarged perspective view showing a structural example of a fixing part of a printed circuit board.
Figure 3:
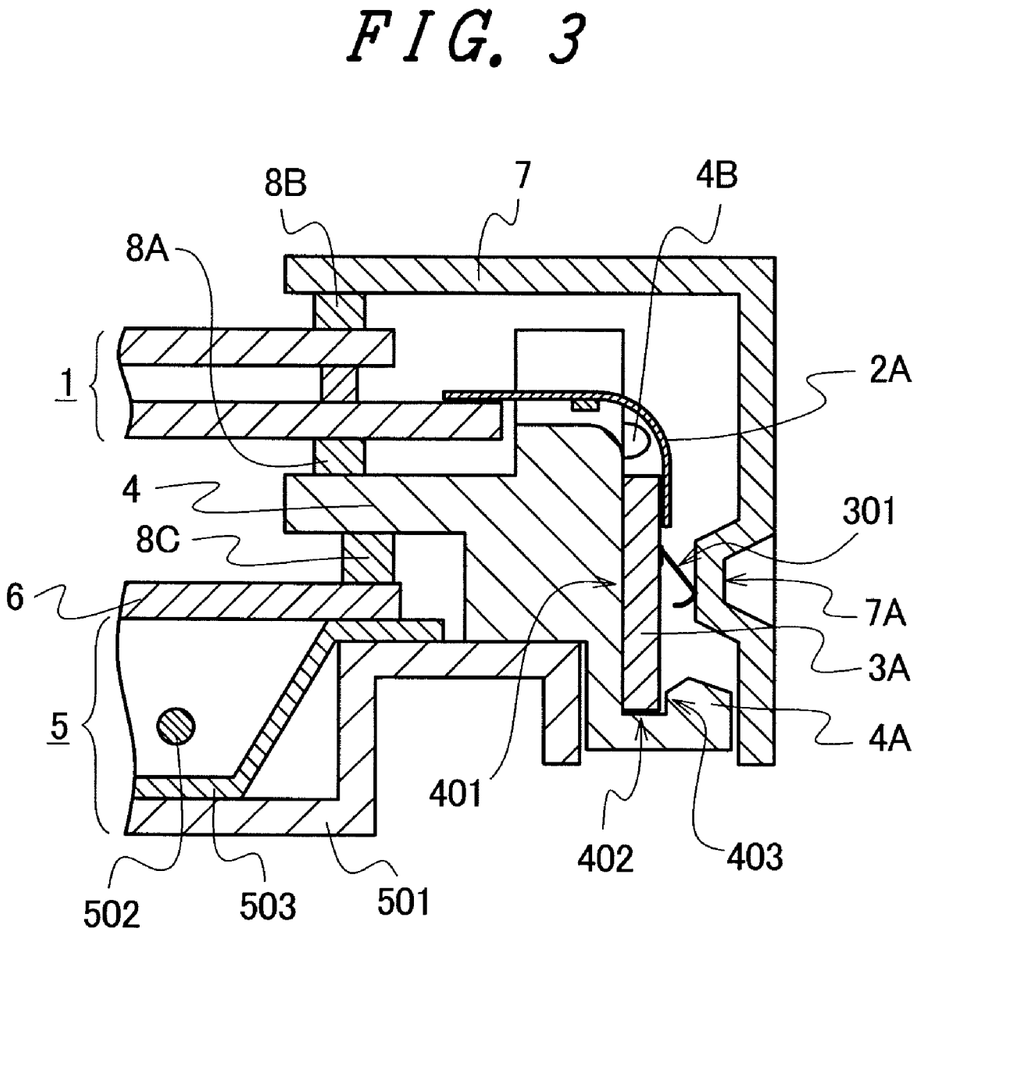
FIG. 3 is a schematic view showing a rough structure of the liquid crystal display apparatus of the embodiment of the invention and is a side sectional view seen from line A-A' of FIG. 2.

FIGS. 1 to 3 are schematic views showing a rough structure of a liquid crystal display apparatus of an embodiment of the invention, in which FIG. 1 is an exploded perspective view showing a structural example of the apparatus, FIG. 2 is a partial enlarged perspective view showing a structural example of a fixing part of a printed circuit board, and FIG. 3 is a side sectional view seen from line A-A' of FIG. 2.

As shown in FIG. 1, the liquid crystal display apparatus of the embodiment includes, for example, a liquid crystal display panel 1, flexible printed wiring boards 2A and 2B connected to the liquid crystal display panel 1, printed circuit boards 3A and 3B connected to the flexible printed wiring boards 2A and 2B, a support member 4 to support the display panel 1 and the printed circuit board 3A and 3B, a backlight unit 5 disposed behind the liquid crystal display panel 1, a light diffusing plate 6, and a frame member (upper frame) 7 to integrally hold these.

The liquid crystal display panel 1 is a display panel in which a liquid crystal material is sealed between a pair of substrates, and for example, plural data signal lines and scanning signal lines are arranged in a grid form on one of the substrates. At this time, an area surrounded by two adjacent data signal lines and two adjacent scanning signal lines corresponds to one pixel area. A TFT element having a gate electrode connected to the scanning signal line and a drain electrode connected to the data signal line is disposed in each pixel area. The source electrode of the TFT element is connected to a pixel electrode. In the liquid crystal display panel, a common electrode is provided on one of the pair of substrates, orientations of liquid crystal molecules are controlled by the intensity of an electric field generated between the pixel electrode and the common electrode, and an image is displayed.

Besides, the printed circuit board includes the printed circuit board 3A to send video signals and the like to the data signal lines of the liquid crystal display panel 1, and the printed circuit board 3B to send scanning signals to the scanning signal lines, and these printed circuit boards 3A and 3B are disposed at the outer peripheral part of the liquid crystal display panel 1. At this time, wiring lines of the printed circuit board 3A and the data signal lines of the liquid crystal display panel 1 are connected to each other through the flexible printed wiring board 2A, and wiring lines of the printed circuit board 3B and the scanning signal lines of the liquid crystal display panel 1 are connected to each other through the flexible printed wiring board 2B. At this time, for example, a driver IC is mounted on the flexible printed wiring board 2A, 2B.

Incidentally, in FIG. 1, although the flexible printed wiring boards 2A and 2B and the printed circuit boards 3A and 3B are separated from each other, in an actual display apparatus, the wiring lines of the flexible printed wiring board 2A and the wiring lines of the printed circuit board 3A, and the wiring lines of the flexible printed wiring board 2B and the wiring lines of the printed circuit board 3B are connected to each other.

Besides, in the liquid crystal display apparatus as stated above, for example, as shown in FIG. 2 and FIG. 3, the liquid crystal panel 1 is supported so as to be sandwiched between the support member 4 and the upper frame 7. At this time, spacers 8A and 8B made of, for example, elastic material respectively intervene between the liquid crystal display panel 1 and the support member 4 and between the liquid crystal display panel 1 and the upper frame 7.

Besides, the printed circuit board 3A is supported at, for example, an outer peripheral side surface 401 of the support member 4 by bending the flexible printed wiring board 2A. At this time, as shown in FIG. 2 and FIG. 3, the support member 4 includes a groove-like first support part 4A to support a second end of the printed circuit board 3A opposite to a first end to which the flexible printed wiring board 2A is connected, and a projection-like second support part 4B to support the first end.

The first support part 4A of the support member 4 includes a first support surface 402 to support a side surface of the second end of the printed circuit board 3A and a second support surface 403 opposite to a vicinity of an end of a back surface of a surface opposite to the support member 4 of the printed circuit board 3. At this time, the movement of the printed circuit board 3 in the horizontal direction is suppressed by the end sandwiched between the outer peripheral side surface 401 of the support member 4 and the second support surface 403 of the first support part 4A.

Besides, as shown in FIG. 2 and FIG. 3, the second support part 4B of the support member 4 is provided outside the area where the printed circuit board 3A is supported. At this time, the movement of the printed circuit board 3A in the vertical direction is suppressed by the first support surface 402 of the first support part 4A of the support member 4 and the second support part 4B.

Besides, in general, plural flexible printed wiring boards 2A are connected to the one printed circuit board 3A. Thus, the second support part 4B of the support member 4 is disposed between the flexible printed wiring boards 2A.

Besides, as shown in FIG. 2 and FIG. 3, the printed circuit board 3A is provided with a plate spring-like ground member (shield finger) 301. This ground member 301 is electrically connected to, for example, a wiring line (not shown) of ground potential provided on the printed circuit board 3A. As shown in FIG. 3, the ground member 301 is in contact with the upper frame 7, and electrical continuity is ensured. At this time, a contact part 7A protruded in a direction toward the support member 4 by, for example, deep drawing or the like is provided in the upper frame 7.

Although FIG. 2 and FIG. 3 show the support part of the flexible printed wiring board 2A connected to the data signal lines of the liquid crystal display panel 1 and the printed circuit board 3A, a support part of the flexible printed wiring board 2B connected to the scanning signal lines of the liquid crystal display panel and the printed circuit board 3B also has the same structure.

Besides, as shown in FIG. 3, the backlight unit 5 is such that for example, a light source 502, such as a cold cathode fluorescent tube, and a reflecting plate 503 are contained in a frame member (lower frame) 501, and a film-like optical member, such as a light diffusing plate 6, is disposed between the light source 502 and the liquid crystal display panel 1. At this time, the ends of the light diffusing plate 6 and the reflecting plate 503 are supported so as to be sandwiched between the support member 4 and the lower frame 501. Besides, at this time, a spacer 8C made of, for example, an elastic material intervenes between the support member 4 and the light diffusing plate 6.

Figure 4:
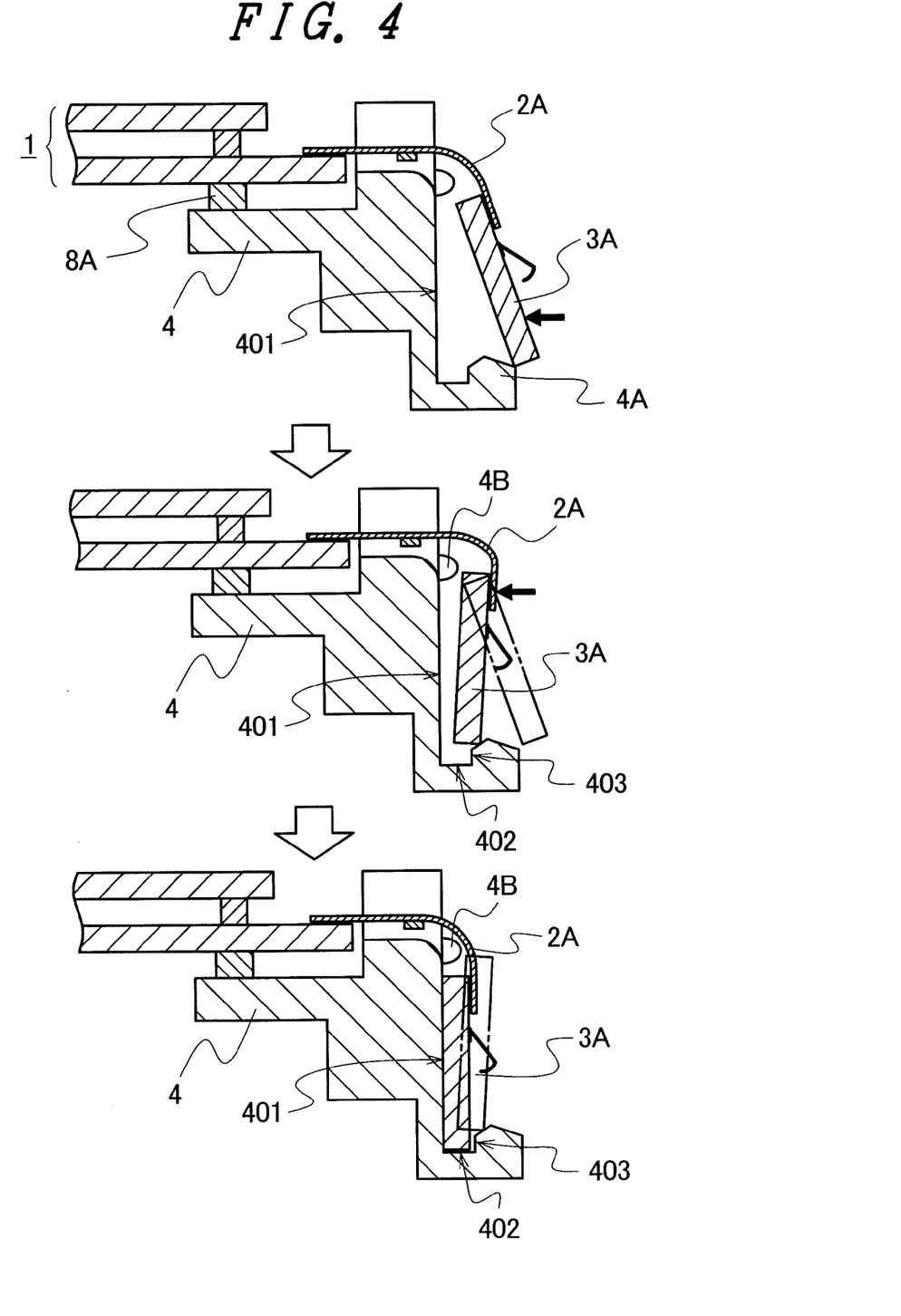
FIG. 4 is a schematic view for explaining an assembling method of a liquid crystal display apparatus of the invention and is a view showing a procedure of fixing a printed circuit board to a support member.
Figure 5:
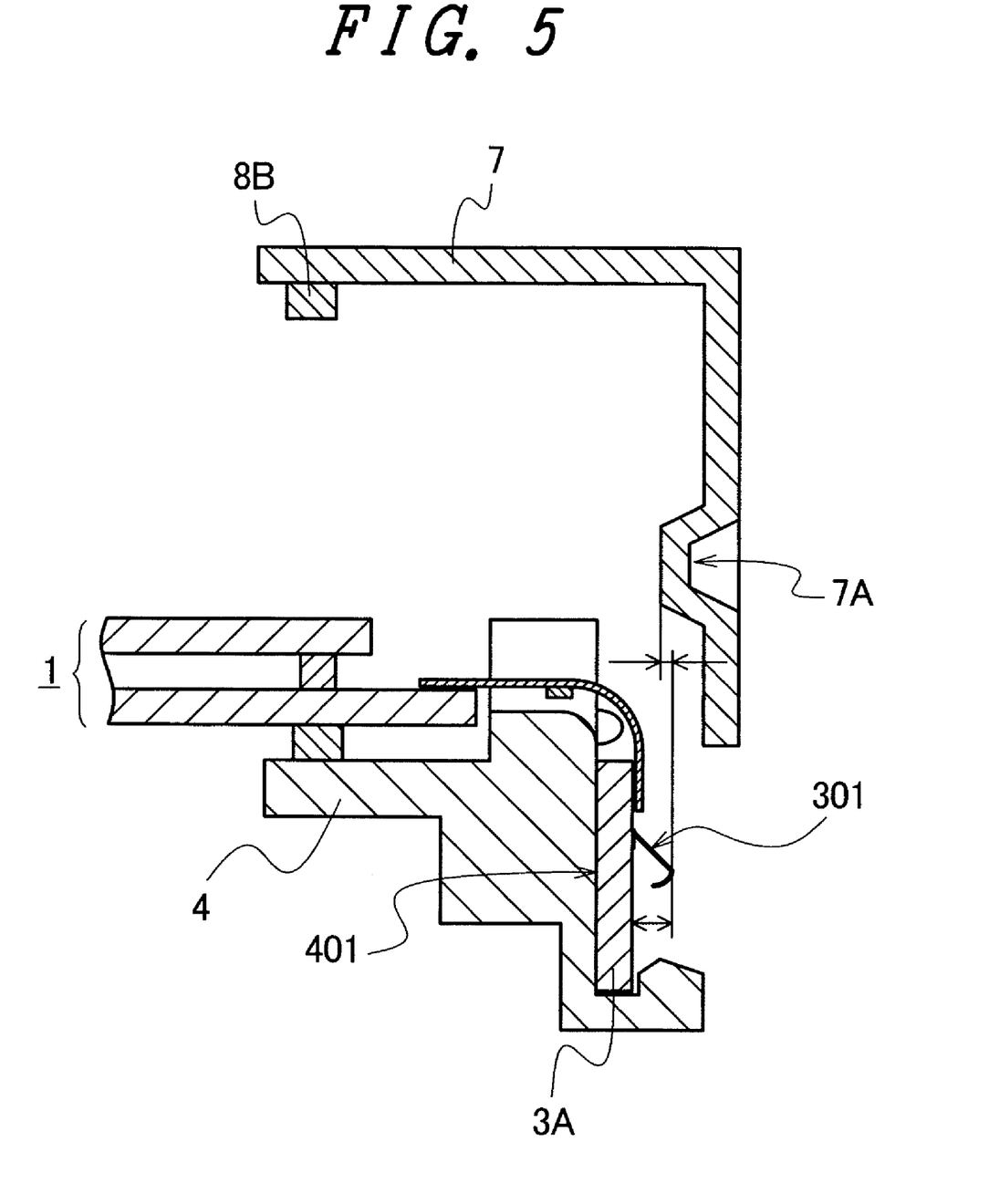
FIG. 5 is a schematic view for explaining the assembling method of the liquid crystal display apparatus of the invention and is a view showing a process of causing an upper frame to cover.

FIG. 4 and FIG. 5 are schematic views for explaining an assembling method of a liquid crystal display apparatus of the invention, in which FIG. 4 is a view showing a procedure of fixing a printed circuit board to a support member, and FIG. 5 is a view showing a process of causing an upper frame to cover.

When the liquid crystal display apparatus of the embodiment is assembled, for example, first, the optical member such as the light diffusing plate 6 is placed on the backlight unit 5, and after the support member 4 is placed thereon, the liquid crystal display panel 1 is placed on the support member 4. At this time, for example, as shown at the upper stage of FIG. 4, the liquid crystal display panel 1 is previously connected with the printed circuit board 3A through the flexible printed wiring board 2A. Besides, at this time, although not shown, the liquid crystal display panel is also connected with the printed circuit board 3B through the flexible printed wiring board 2B.

After the liquid crystal display panel 1 is placed on the support member 4, when the printed circuit boards 3A and 3B are attached to the support member 4, the second end side of the printed circuit board 3A is pushed in the direction toward the outer peripheral side surface 401 of the support member 4. At this time, the second end of the printed circuit board 3A comes in contact with the first support part 4A of the support member 4, and is moved along its surface. The second end of the printed circuit board 3A is inserted into the groove part formed of the outer peripheral side surface 401 of the support member 4, the first support surface 402 of the first support part, and the second support surface 403. Thereafter, when the first end side of the printed circuit board 3A is pushed so as to come in contact with the outer peripheral side surface 401 of the support member 4, the attachment operation of the printed circuit board 3A is completed. Thereafter, in a similar procedure, the printed circuit board 3B is attached to the support member 4.

Besides, at this time, the second support part 4B of the support member 4 is located outside the area where the printed circuit boards 3A and 3B are supported. Thus, when the second end of the printed circuit board 3A, 3B is inserted into the first support part 4A, it is possible to prevent unnecessary bending deformation from being applied to the flexible printed wiring board 2A, 2B, and to prevent disconnection or the like of a wiring line of the flexible printed wiring board 2A, 2B.

Besides, after the printed circuit boards 3A and 3B are attached to the support member 4, as shown in FIG. 5, the upper frame 7 is put thereon, and the upper frame 7 and the lower frame (not shown) 501 are fixed by, for example, screwing or the like. At this time, in order to more ensure the connection between the ground member 301 of the printed circuit board 3A, 3B and the upper frame 7, for example, as shown in FIG. 5, it is preferable that the distance from the printed circuit board 3A to the contact part 7A of the upper frame 7 is shorter than the height of the ground member 301 from the printed circuit board 3A.

By doing so, the printed circuit board 3A can be easily attached to the outer peripheral side surface 401 of the support member 4, and the workability is improved.

Figure 6:
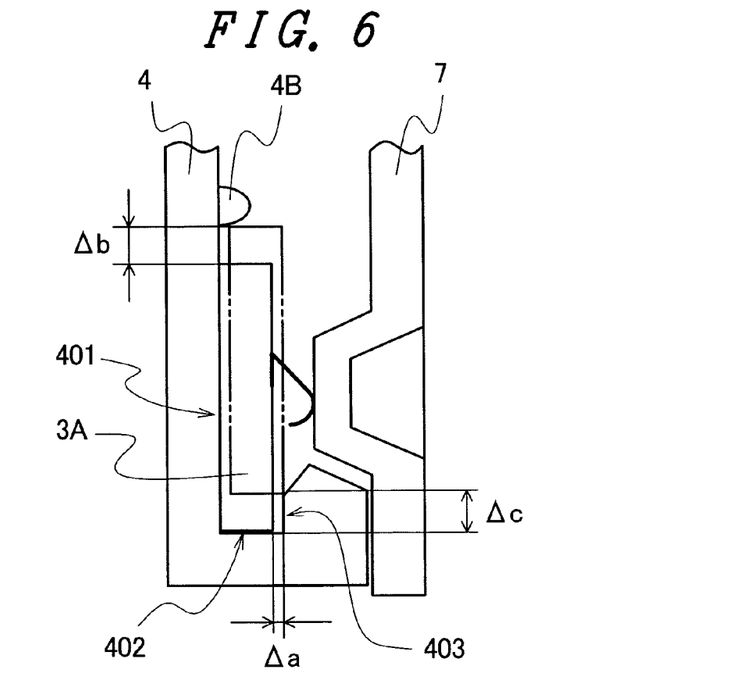
FIG. 6 is a schematic view showing an example of a relation between a first support part of a support member and a second support part.
Figure 7:
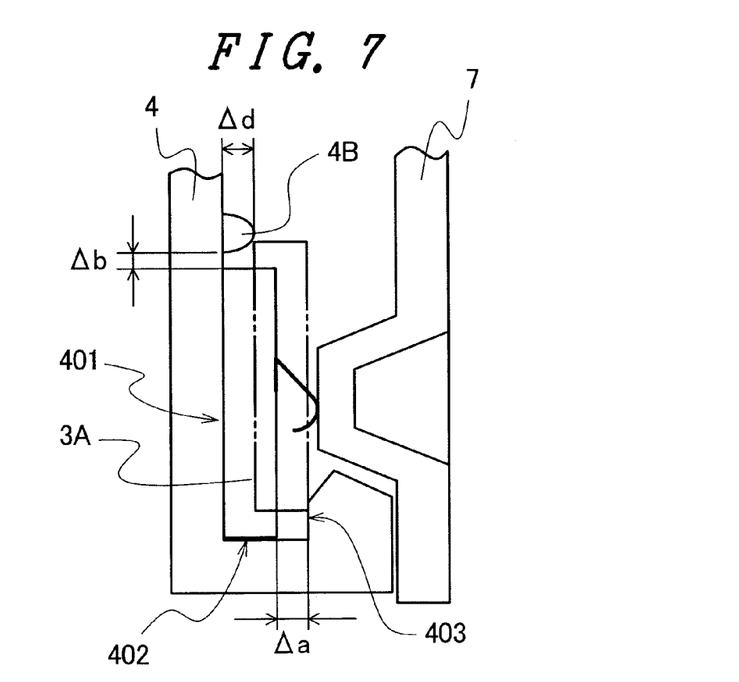
FIG. 7 is a schematic view showing another example of a relation between a first support part of a support member and a second support part.

FIG. 6 is a schematic view showing an example of a relation between the first support part of the support member and the second support part. FIG. 7 is a schematic view showing another example of a relation between the first support part of the support member and the second support part.

In the liquid crystal display apparatus of this embodiment, the second end of the printed circuit board 3A, 3B is inserted into the groove-like first support part 4A provided in the support member 4, and the movement of the printed circuit board 3A, 3B in the direction perpendicular to the side surface 401 of the support member 4 is suppressed. Besides, the projection-like second support part 4B is provided at the position opposite to the first end of the printed circuit board 3A, 3B, so that the movement of the printed circuit board 3A, 3B in the direction parallel to the side surface 401 of the support member 4 is suppressed.

At this time, for example, when importance is attached to the suppression of the movement of the printed circuit board 3A, 3B in the direction perpendicular to the side surface 401 of the support member 4, as shown in FIG. 6, a gap generated in the first support part 4A of the support member 4, that is, a difference Δa between the distance from the side surface 401 of the support member to the second support surface 403 and the thickness of the printed circuit board 3A is made small. However, in the case where the gap Δa generated in the first support part 4A of the support member 4 is made small, when the end of the printed circuit board 3A is inserted into the first support part 4A, an angle between the printed circuit board 3A and the side surface 401 of the support member becomes small. Thus, when the printed circuit board 3A is inserted, in order to prevent the interference between the printed circuit board 3A and the second support part 4B of the support member, a distance Δb from the first end of the printed circuit board 3A to the second support part 4B of the support member 4 is made large. However, merely when the distance Δb from the first end of the printed circuit board 3A to the second support 4B of the support member is made large, for example, when the first end of the printed circuit board 3A comes in contact with the second support part 4B of the support member by vibration or the like, there is a possibility that the second end of the printed circuit board 3A comes off from the first support 4A of the support member. Thus, in the case where the distance Δb from the first end of the printed circuit board 3A to the second support part 4B of the support member is made large, it is preferable that a width Δc of the second support surface 403 of the first support part 4A is made larger than the distance Δb from the first end of the printed circuit board 3A to the second support part 4B of the support member.

On the other hand, for example, when importance is attached to the suppression of the movement of the printed circuit board 3A in the direction parallel to the side surface 401 of the support member 4, as shown in FIG. 7, the gap generated in the first support part 4A of the support member 4, that is, the difference Δa between the distance from the side surface 401 of the support member to the second support surface 403 and the thickness of the printed circuit board 3A is made large. By doing so, when the end of the printed circuit board 3A is inserted into the first support part 4A, the angle between the printed circuit board 3A and the side surface 401 of the support member can be made large. Thus, when the printed circuit board 3A is inserted, the distance Δb from the first end of the printed circuit board 3A to the second support part 4B of the support member can be made small. However, in this case, for example, when the printed circuit board 3A is moved vertically in the state where it is in contact with the second support surface 403 of the first support part 4A, in order to prevent the printed circuit board 3A from coming off from the first support part 4A, it is preferable that a height Δd of the second support part 4B is made larger than the gap Δa generated in the first support part 4A of the support member.

Figure 8:
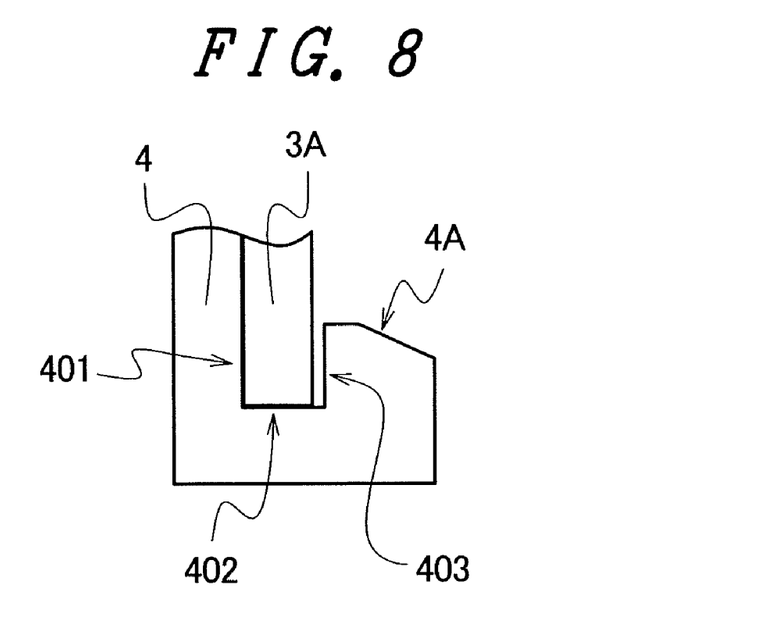
FIG. 8 is a schematic view for explaining a first modified example of the embodiment.
Figure 9:
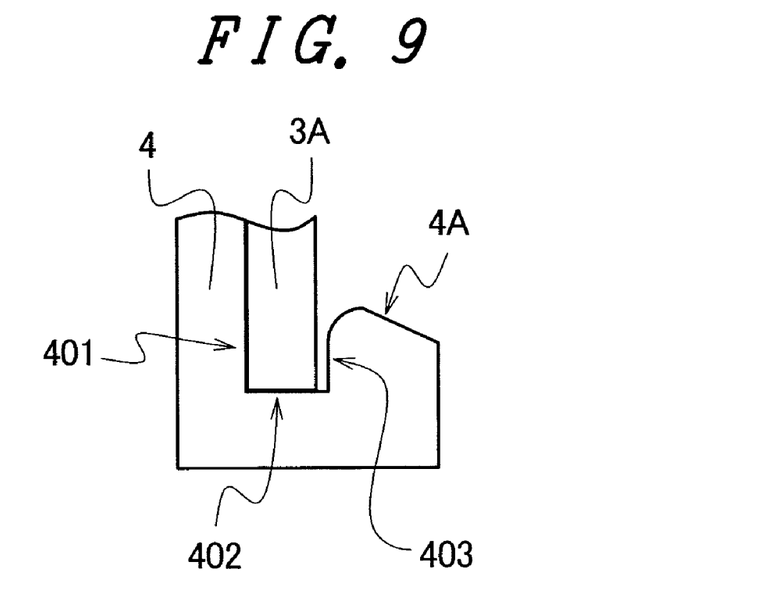
FIG. 9 is a schematic view for explaining a second modified example of the embodiment.

FIG. 8 is a schematic view for explaining a first modified example of the embodiment. FIG. 9 is a schematic view for explaining a second modified example of the embodiment.

In the description up to here, for example, as shown in FIG. 3 and FIG. 4, the first support part 4A of the support member 4 is provided with an inclined surface part on the second support surface 403, in which as a distance from the first support surface 402 becomes large, a distance from the side surface 401 of the support member becomes large. However, the second support surface 403 is not limited to the surface having the inclined surface part as stated above, and for example, as shown in FIG. 8, the whole may be parallel to the side surface 401 of the support member. Further, for example, as shown in FIG. 9, the surface may be chamfered to form a curved surface.

Figure 10:
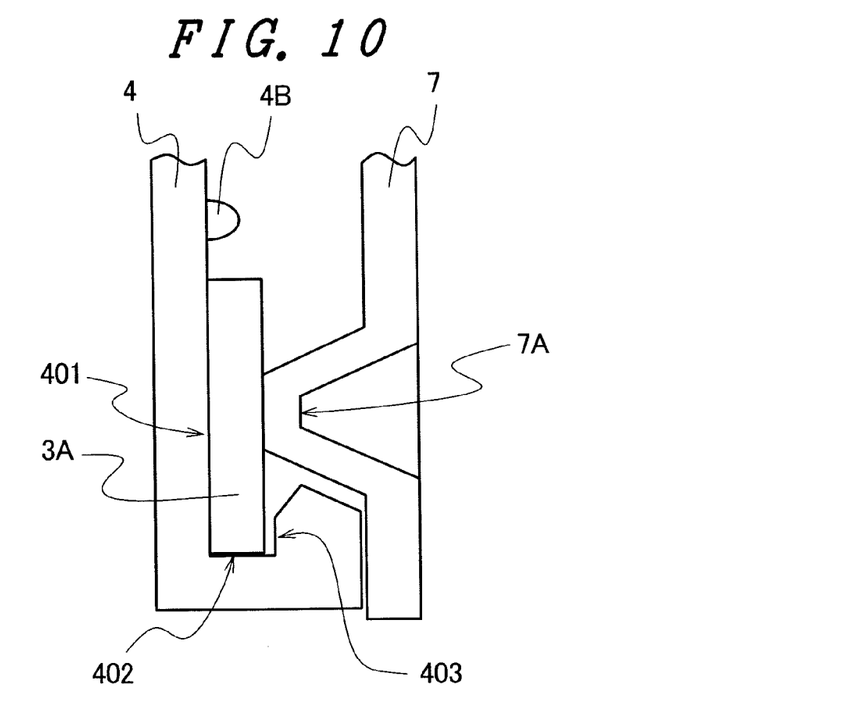
FIG. 10 is a schematic view for explaining a third modified example of the embodiment.

FIG. 10 is a schematic view for explaining a third modified example of the embodiment.

In the description up to here, for example, as shown in FIG. 2 or FIG. 3, the plate spring-like ground member (shield finger) 301 is provided on the printed circuit board 3A, 3B, and the ground member 301 is brought into contact with the upper frame 7, so that the electrical continuity between the wiring line of the ground potential provided on the printed circuit board 3A, 3B and the upper frame 7 is ensured. However, no limitation is made to this, and for example, as shown in FIG. 10, the depth (height) of the contact part 7A of the upper frame 7 is made large, and the electrical continuity may be ensured by directly bringing the wiring line (not shown) of the ground potential provided on the printed circuit board 3A, 3B into contact with the contact part 7A of the upper frame 7.

Although the invention has been specifically described based on the embodiment, the invention is not limited to the embodiment, and it is needless to say that various modifications can be made within the scope not departing from the gist.

For example, in the embodiment, although the liquid crystal display apparatus including the backlight unit is exemplified, no limitation is made to this, and the invention can be applied to a liquid crystal display apparatus having no backlight.

Besides, the invention is not limited to the liquid crystal display apparatus, but can be applied to any display apparatus as long as the display apparatus is such that a wiring line of a display panel and a wiring line of a printed circuit board are connected to each other through a flexible printed wiring board, and the display panel and the printed circuit board are supported by a support member. In addition to the liquid crystal display apparatus, as the display apparatus to which the invention can be applied, for example, a display apparatus including a PDP (Plasma Display Panel), a display apparatus including an organic EL (Electro Luminescence) display and the like can be named.

What is claimed is:

1. A display apparatus comprising:
    a display panel on which plural data signal lines and plural scanning signal lines are arranged in a grid form;
    a flexible printed wiring board including wiring lines connected to the data signal lines or the scanning signal lines of the display panel;
    a printed circuit board including wiring lines connected at a first end of a first main surface of the printed circuit board to the wiring lines of the flexible printed wiring board,
    wherein the printed circuit board includes a first end side surface adjacent to the first end of the first main surface, and a second end side surface adjacent to a second end of the first main surface of the printed circuit board which is opposite to the first end of the first main surface,
    a groove-like part adjacent with the second end side surface of the printed circuit board, wherein the groove-like part includes a first surface opposite the second end side surface of the printed circuit board and a second surface opposite to the second end of the first main surface of the printed circuit board, and
    a projection-like part which overlaps at least a part of the first end side surface of the printed circuit board in a plane view, wherein the projection-like part is provided outside an area where the printed circuit board is placed.

2. The display apparatus according to claim 1, wherein a frame member which covers the printed circuit board is a conductive member.

3. The display apparatus according to claim 1, wherein the printed circuit board is connected with plural flexible printed wiring boards, and
    the projection-like part is provided at least in one portion between the adjacent flexible printed wiring boards.

4. The display apparatus according to claim 1, wherein a frame member which covers the printed circuit board is a conductive member, wherein the printed circuit board includes a plate spring-like ground member at the first main surface of the printed circuit board, and
    wherein the ground member is in contact with the frame member.

5. The display apparatus according to claim 1, wherein a frame member which covers the printed circuit board is a conductive member, and
    wherein the frame member has a contact portion for contacting the printed circuit board.

6. The display apparatus according to claim 1, wherein the second surface of the groove-like part includes an inclined surface part in which as a distance from the first surface becomes large, a distance from the first main surface of the printed circuit board becomes large.

7. The display apparatus according to claim 4, wherein a contact portion of the frame member for contacting the printed circuit board has a conic form.

* * * * *